United States Patent
Beintner et al.

(10) Patent No.: US 8,614,485 B2
(45) Date of Patent: Dec. 24, 2013

(54) PROCESS FOR FABRICATION OF FINFETS

(75) Inventors: Jochen Beintner, Reutlingen (DE); Gary B. Bronner, Stormville, NY (US); Ramachandra Divakaruni, Ossining, NY (US); Yujun Li, Portland, OR (US)

(73) Assignee: International Business Machines Corporation, Armonk, NY (US)

( * ) Notice: Subject to any disclaimer, the term of this patent is extended or adjusted under 35 U.S.C. 154(b) by 832 days.

(21) Appl. No.: 12/342,655

(22) Filed: Dec. 23, 2008

(65) Prior Publication Data

US 2009/0101995 A1   Apr. 23, 2009

Related U.S. Application Data

(62) Division of application No. 11/559,460, filed on Nov. 14, 2006, now Pat. No. 7,470,570.

(51) Int. Cl.
   *H01L 29/78* (2006.01)
(52) U.S. Cl.
   USPC .......................................................... 257/344
(58) Field of Classification Search
   USPC ........................... 257/296, 344, 350, 351, 369
   See application file for complete search history.

(56) References Cited

U.S. PATENT DOCUMENTS

| | | | |
|---|---|---|---|
| 7,074,662 B2 | 7/2006 | Lee et al. | |
| 7,098,498 B2 | 8/2006 | Diorio et al. | |
| 7,105,934 B2 | 9/2006 | Anderson et al. | |
| 7,148,526 B1 | 12/2006 | An et al. | |
| 7,214,576 B1 | 5/2007 | Kaneko et al. | |
| 7,224,029 B2 | 5/2007 | Anderson et al. | |
| 2002/0011612 A1* | 1/2002 | Hieda | 257/262 |
| 2003/0186518 A1* | 10/2003 | Callegari et al. | 438/528 |
| 2005/0208715 A1* | 9/2005 | Seo et al. | 438/197 |
| 2005/0275015 A1* | 12/2005 | Anderson et al. | 257/338 |

OTHER PUBLICATIONS

Yan, Ran-Hong et al., "Scaling the Si MOSFET: From Bulk to SOI to Bulk," IEEE Trans. Elec. Dev., Jul. 1992, 1704-1710, vol. 39, No. 7.
Park, T. et al., "Fabrication of Body-Tied FinFETs (Omega MOSFETs) Using Bulk Si Wafers," Symp. VLSI Tech. Dig. Tech. Pap., 2003, 135-136.

* cited by examiner

*Primary Examiner* — Thomas L Dickey
(74) *Attorney, Agent, or Firm* — Scully, Scott, Murphy & Presser, P.C.; Louis J. Percello, Esq.

(57) ABSTRACT

A method of fabricating a plurality of FinFETs on a semiconductor substrate in which the gate width of each individual FinFET is defined utilizing only a single etching process, instead of two or more, is provided. The inventive method results in improved gate width control and less variation of the gate width of each individual gate across the entire surface of the substrate. The inventive method achieves the above by utilizing a modified sidewall image transfer (SIT) process in which an insulating spacer that is later replaced by a gate conductor is employed and a high-density bottom up oxide fill is used to isolate the gate from the substrate.

12 Claims, 7 Drawing Sheets

PROCESS FOR FABRICATION OF FINFETS

RELATED APPLICATION

This application is a divisional of U.S. patent application Ser. No. 11/559,460, filed Nov. 14, 2006.

FIELD OF THE INVENTION

The present invention relates to semiconductor device fabrication, and more particularly to a method of forming a plurality of FinFETs in which the gate width of each of the FinFETs is defined utilizing a single etching process that results in improved gate width control.

BACKGROUND OF THE INVENTION

Over the past twenty-five years or so, the primary challenge of very large scale integration (VLSI) has been the integration of an ever-increasing number of metal oxide semiconductor field effect transistor (MOSFET) devices with high yield and reliability. This was achieved mainly in the prior art by scaling down the MOSFET channel length without excessive short-channel effects. As is known to those skilled in the art, short-channel effects are the decrease of threshold voltage $V_t$ in short-channel devices due to two-dimensional electrostatic charge sharing between the gate and the source/drain diffusion regions.

To scale down MOSFET channel lengths without excessive short-channel effects, gate oxide thickness has to be reduced while increasing channel-doping concentration. However, Yan, et al., "Scaling the Si MOSFET: From bulk to SOI to bulk", IEEE Trans. Elect. Dev., Vol. 39, p. 1704, Jul. 1992, have shown that to reduce short-channel effects for sub-0.05 μm MOSFETs, it is important to have a backside-conducting layer present in the structure that screens the drain field away from the channel. The Yan, et al. results show that double-gated MOSFETs and MOSFETs with a top gate and a backside ground plane are more immune to short-channel effects and hence can be scaled to shorter dimensions than conventional MOSFETs.

The structure of a typical prior art double-gated MOSFET consists of a very thin vertical semiconductor layer (Fin) for the channel, with two gates, one on each side of the channel. The term "Fin" is used herein to denote a semiconducting material which is employed as the body of the FET. The two gates are electrically connected so that they serve to modulate the channel. Short-channel effects are greatly suppressed in such a structure because the two gates very effectively terminate the drain field line preventing the drain potential from being felt at the source end of the channel. Consequently, the variation of the threshold voltage with drain voltage and with gate length of a prior art double-gated MOSFET is much smaller than that of a conventional single-gated structure of the same channel length.

In the semiconductor industry, semiconductor Fins can be processed either by optical or ebeam lithographic processes in combination with trimming processes such as, for example, resist trimming, hard mask trimming or oxidation trimming. Another method of trimming is by utilizing a sidewall image transfer (SIT) process. The SIT process provides very high-density structures that are independent of lithographic resolution and pitch. The SIT process is based upon a spacer that is formed on the sidewall of an optical defined structure. The spacer is used as a mask to define the structure of the underlying layer or layers.

In conventional FinFET fabrication processes two etching steps are used (one during the lithographic step and another during trimming) which greatly decreases the possibility of forming FinFETs having controlled gate widths.

In view of the above, there is a need for providing a new and improved method of fabricating FinFETs wherein improved gate width control is provided that eliminates the need for utilizing a combination of optical or ebeam lithography and trimming.

SUMMARY OF THE INVENTION

The present invention provides a method of fabricating a plurality of FinFETs on a semiconductor substrate in which the gate width of each individual FinFET is defined utilizing only a single etching process, instead of two or more. The inventive method results in improved gate width control and less variation of the gate width of each individual gate across the entire surface of the substrate. The inventive method achieves the above by utilizing a modified sidewall image transfer (SIT) process in which an insulating spacer that is later replaced by a gate conductor is employed and a high-density bottom up oxide fill is used to isolate the gate from the substrate.

In general terms, the inventive method comprises:

forming a plurality of semiconductor bodies that extend above a semiconductor substrate, each of said semiconductor bodies includes a hard mask material thereon and insulating spacers on sidewalls of each of said semiconductor bodies;

recessing a portion of said semiconductor substrate to form a pedestal region at a footprint of each of said semiconductor bodies;

growing an oxide on exposed surfaces of said semiconductor substrate, including portions of said pedestal regions;

forming an etched anisotropic oxide on said grown oxide;

removing said insulating spacers wherein a gap forms between said anisotropic oxide and each of said semiconductor bodies; and forming a gate dielectric and a gate conductor, wherein said gate dielectric is present on each sidewall of said semiconductor bodies.

In a preferred embodiment of the present invention, the method includes the steps of:

forming a plurality of Si-containing semiconductor bodies that extend above a Si-containing semiconductor substrate, each of said Si-containing semiconductor bodies includes an oxide hard mask thereon and nitride spacers on sidewalls of each of said Si-containing semiconductor bodies;

recessing a portion of said Si-containing semiconductor substrate to form a pedestal region at a footprint of each of said Si-containing semiconductor bodies;

growing an oxide on exposed surfaces of said Si-containing semiconductor substrate, including portions of said pedestal regions;

forming an etched back anisotropic oxide on said grown oxide;

removing said nitride spacers wherein a gap forms between said anisotropic oxide and each of said semiconductor bodies; and forming a gate dielectric and a gate conductor, wherein said gate dielectric is present on each sidewall of said Si-containing semiconductor bodies.

In addition to the method described above, the present invention provides a semiconductor structure. In accordance with the present invention, the semiconductor structure comprises:

a plurality of FinFETs located on a raised surface of a semiconductor substrate, wherein each of said FinFETs includes a gate dielectric and a gate electrode surrounding a semiconductor body, wherein a portion of said gate dielectric and said gate electrode are located in a region between an etched back anisotropic oxide and said semiconductor body.

The inventive structure provides improved gate to source/drain control since a portion of the gate dielectric and the gate conductor are located in a region between the etched back anisotropic oxide and the semiconductor body.

DETAILED DESCRIPTION OF THE INVENTION

The present invention, which provides a method of fabricating FinFETs utilizing a single etching process which results in improved gate width control, will now be described in greater detail by referring to the following discussion and drawings that accompany the present application. It is noted that the drawings of the present application are provided for illustrative purposes and, as such, they are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced with viable alternative process options without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

As stated above, the present invention provides a method of fabricating a plurality of FinFETs in a semiconductor substrate in which the gate width of each individual FinFET is defined utilizing only a single etching process, instead of two or more. The inventive method results in improved gate width control and less variation of the gate width of each individual gate across the entire surface of the substrate. The inventive method achieves the above by utilizing a modified sidewall image transfer (SIT) process in which an insulating spacer that is later replaced by a gate conductor, such as, polysilicon, is employed and a high-density bottom up oxide fill is used to isolate the gate from the substrate.

Reference is now made to FIGS. 1-15 which illustrate the basic processing steps that are utilized in the present invention for forming a plurality of FinFETs on a semiconductor substrate.

Figure 1:
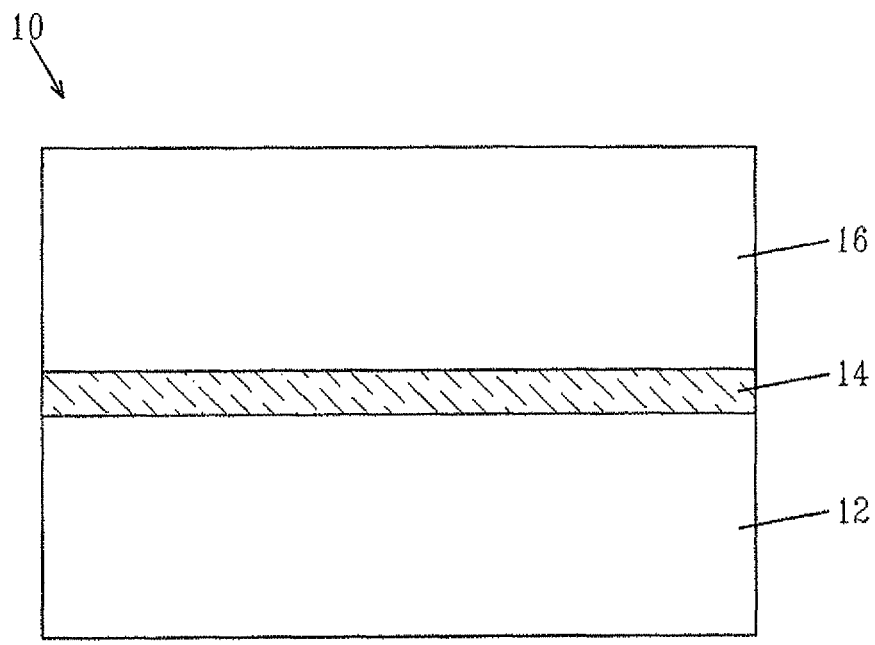
FIGS. 1-15 are pictorial representations (through cross sectional views) illustrating the basic processing steps of the present invention.

FIG. 1 is a cross sectional view of an initial structure 10 that can be employed in the present invention. Specifically, the initial structure 10 shown in FIG. 1 is either a semiconductor-on-insulator substrate (SOI) or a pseudo SOI like substrate. Preferably, pseudo SOI like substrates are employed. The term "pseudo SOI like" is used in the present application to denote a structure that has SOI like properties, yet the insulating layer and the top semiconductor layer are formed on a bulk Si containing substrate utilizing only deposition or growing processes.

The initial structure 10 shown in FIG. 1 comprises a bottom Si-containing semiconductor layer 12, an insulating layer 14, and a top Si-containing semiconductor layer 16. The term "Si-containing" is used throughout the instant application to denote a semiconductor material that includes Si. Illustrative examples of Si-containing semiconductor materials include, Si, SiGe, SiC, SiGeC, amorphous Si and multilayers thereof.

The top and bottom Si-containing semiconductor layers 16 and 12, respectively, may comprise the same, or different, Si-containing semiconductor material. In one embodiment, the top and bottom semiconductor layers comprise Si. In yet another embodiment, the bottom Si-containing layer 12 comprises Si, while the top Si-containing semiconductor material comprises amorphous Si.

The insulating layer 14 may be a crystalline or non-crystalline oxide or nitride. In a preferred embodiment of the present invention, the insulating layer 14 is an oxide. The insulating layer 14 may be continuous, as shown, or it may be discontinuous. When a discontinuous insulating layer is present, the insulating layer exists as an isolated island that is surrounded by semiconductor material.

The initial structure 10 may be formed utilizing standard processes including for example, SIMOX (separation by ion implantation of oxygen) or layer transfer. When a layer transfer process is employed, an optional thinning step may follow the bonding of two semiconductor wafers together. The optional thinning step reduces the thickness of the top semiconductor layer to a layer having a thickness that is more desirable.

When a pseudo SOI like substrate is used as structure 10, the pseudo SOI like substrate is formed by first forming the insulating layer 14 on a surface of a bulk substrate (i.e., the bottom Si-containing semiconductor layer 12). The insulating layer 14 may be formed by thermal means such as, for example, oxidation or nitridation. Alternatively, the insulating layer 14 of the pseudo SOI like substrate can be formed by a conventional deposition process including, but not limited to, chemical vapor deposition (CVD), plasma enhanced chemical vapor deposition (PECVD), chemical solution deposition, evaporation, and atomic layer deposition (ALD). The top Si-containing semiconductor layer 16 of the pseudo SOI like substrate is formed by a conventional deposition process such as, for example, epitaxial growth.

The thickness of the top Si-containing semiconductor layer 16 of the structure 10 is typically from about 100 to about 1000 Å, with a thickness from about 500 to about 700 Å being more highly preferred. If the thickness of the top Si-containing semiconductor layer 16 is not within the above-mentioned range, a thinning step such as, for example, planarization or etching may be used to reduce the thickness of the top Si-containing semiconductor layer 16 to a value within the range mentioned above. The thinning step is performed prior to patterning the top Si-containing semiconductor layer 16.

The insulating layer 14 of the structure 10 has a thickness from about 10 to about 2000 Å, with a thickness from about 1000 to about 1500 Å being more highly preferred. The thickness of the bottom Si-containing semiconductor layer 12 is inconsequential to the present invention.

Figure 2:
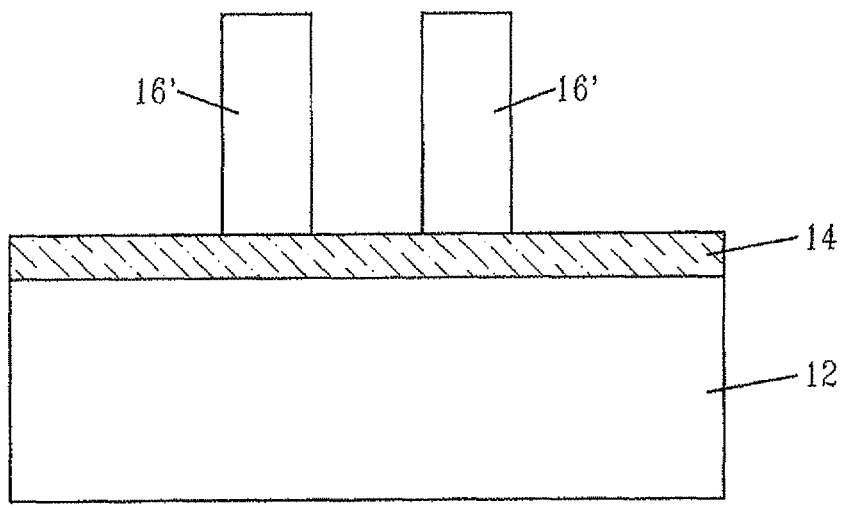

FIG. 2 shows the resulting structure that is formed after the top Si-containing semiconductor layer 16 has been patterned to form a plurality of patterned Si-containing semiconductor layers 16' on the surface of insulating layer 14. The plurality of patterned semiconductor layers 16' is formed by first providing a hard mask (not shown) on a surface of the top semiconductor layer 16 utilizing a conventional deposition process such as, for example, chemical vapor deposition (CVD), plasma enhanced chemical vapor deposition (PECVD), chemical solution deposition, evaporation and other like deposition processes. Alternatively, the hard mask may be formed by a thermal process such as, for example, oxidation or nitridation. Any combination of the above mentioned processes can also be used in forming the hard mask.

The hard mask comprises an oxide, nitride, oxynitride or any combination thereof including multilayers. In one embodiment of the present invention, the hard mask is an oxide including, for example, silicon oxide or silicon oxynitride. The thickness of the hard mask may vary depending on the technique used in forming the same, the material of the hard mask itself, and the number of layers within the hard mask layer. Typically, the hard mask has a thickness from about 200 to about 800 Å. It is noted that the hard mask is utilized in the present invention during a subsequent etching of the top semiconductor layer 16 and is then typically removed from the structure utilizing a conventional stripping process.

After forming the hard mask, a lithographic process and etching are employed. The lithographic process includes applying a photoresist (not shown) atop the hard mask, exposing the photoresist to a desired pattern of radiation, and developing the exposed resist utilizing a conventional resist developer. The etching process comprises drying etching and/or wet chemical etching. Illustrative examples of suitable dry etching processes that can be used in the present invention include reactive ion etching, ion beam etching, plasma etching or laser ablation. Typically, a reactive ion etching process or an ion beam etching process is used. The etching process first transfers the pattern from the patterned photoresist to the hard mask and thereafter to the underlying top Si-containing semiconductor layer 16. The patterned photoresist is typically, but not necessarily always, removed after the pattern has been transferred to the hard mask. A conventional resist stripping process is used to remove the patterned photoresist from the structure.

Figure 3:
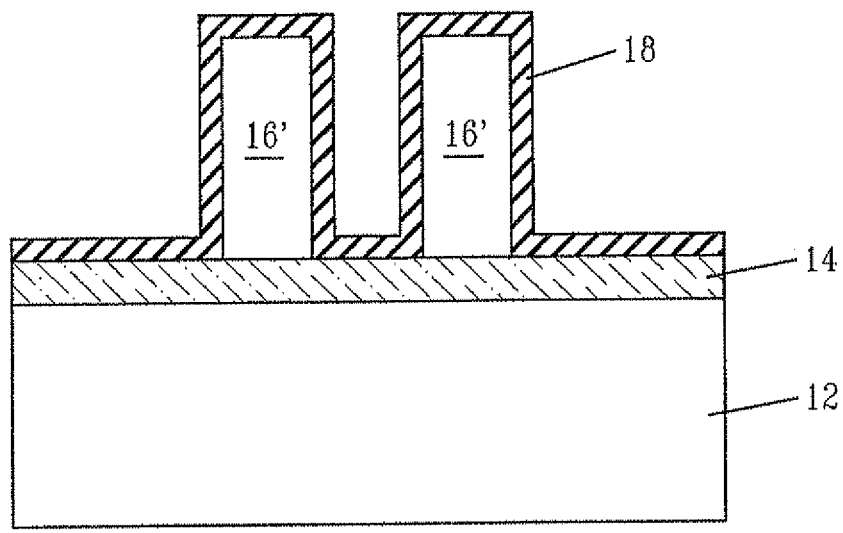

FIG. 3 shows the structure that is formed after forming a dielectric liner 18 on all exposed surfaces of the structure shown in FIG. 2, including exposed surfaces of insulating layer 14 and exposed surfaces of the plurality of patterned Si-containing semiconductor layers 16'. It is noted that the dielectric liner 18 comprises an insulating material that is different from that of the insulating layer 14. For example, and when the insulating layer 14 is an oxide, the dielectric liner 18 is a nitride. The different types of insulating materials are required to provide etch selectivity for a subsequent etch that is used in defining the plurality of Fins in the bottom Si-containing layer 12.

The dielectric liner 18 is formed by either a thermal process or by a deposition process including those mentioned above for forming insulating layer 14. The thickness of the dielectric liner 18 may vary depending on the technique used in forming the same. Typically, the dielectric liner 18 has a thickness from about 1 to about 20 nm, with a thickness from about 10 to about 20 nm being even more typical.

Figure 4:
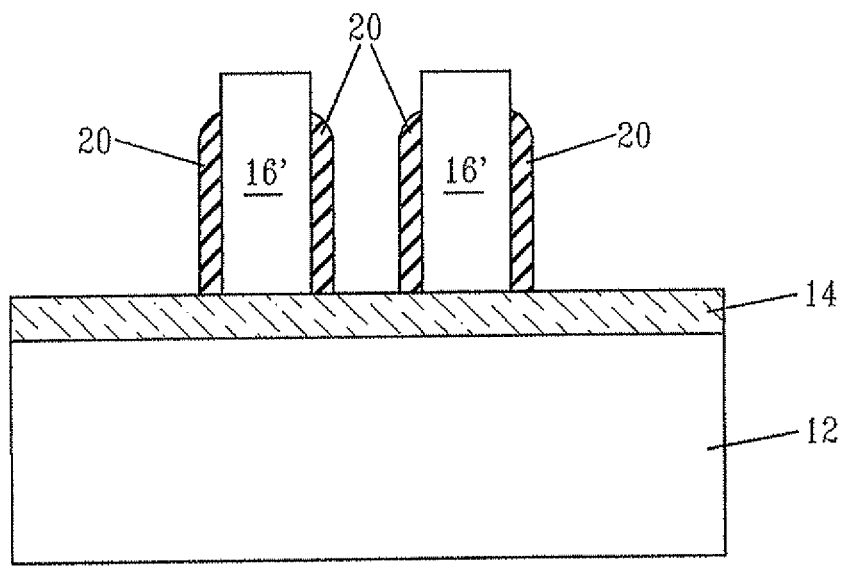

Next, and as is shown in FIG. 4, a timed etching process such as, for example, reactive ion etching is employed to convert the dielectric liner 18 into insulating spacers 20. As shown, each insulating spacer 20 that is formed protects a lower portion of a patterned Si-containing semiconductor layer 16', while leaving an upper portion, including the upper horizontal surface, of each patterned Si-containing layer 16' exposed. The timed etching process employed is selective for removing the dielectric liner 18.

Figure 5:
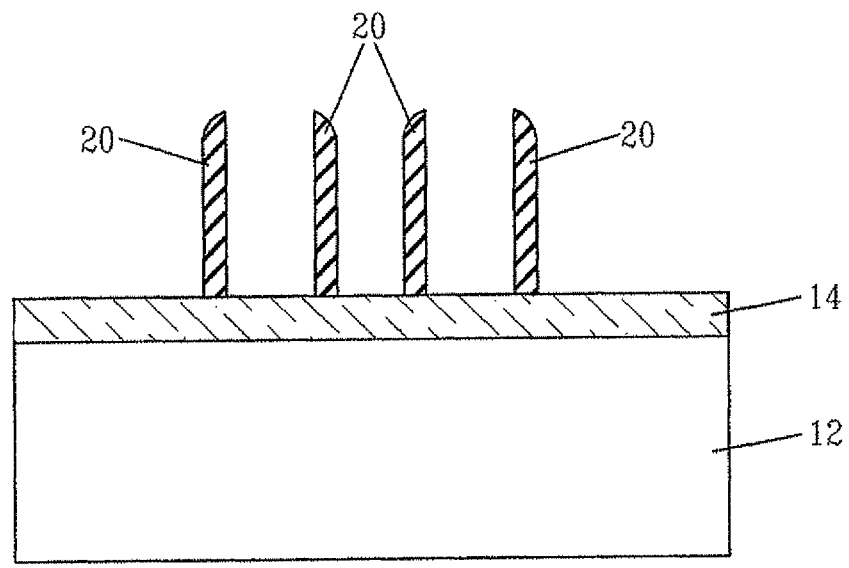

FIG. 5 shows the resultant structure that is formed after each of the patterned Si-containing semiconductor layers 16' has been removed from the structure illustrated in FIG. 4. This removal step leaves behind insulating spacers 20 that are used in defining the plurality of Fins in the underlying bottom semiconductor layer 12. The removal of the patterned Si-containing semiconductor layers 16' is achieved utilizing an etching process that selectively removes silicon as compared to an insulating material.

Figure 6:
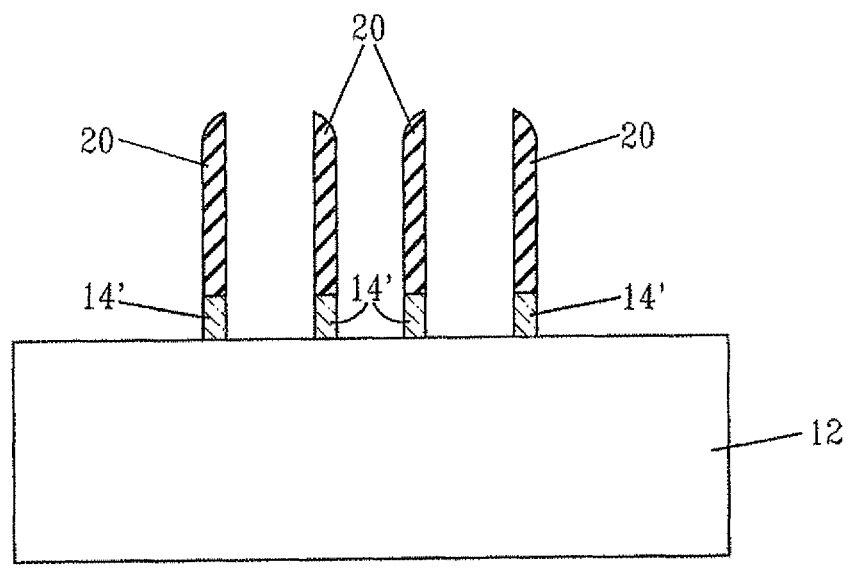
Figure 7:
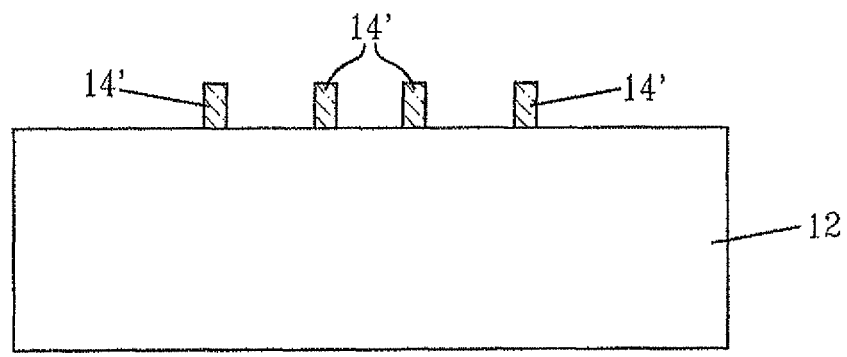

FIG. 6 shows the structure that is formed after removing exposed portions of the insulating layer 14 that are not protected by insulating spacers 20. The remaining insulating layers are used as hard masks 14' for forming Fins (i.e., semiconducting bodies) into the underlying bottom semiconductor layer 12. The removal of the exposed portions of insulating layer 14, not protected by insulating spacers 20, is achieved utilizing an etching process that selectively removes the material of insulating layer 14, relative to insulating spacers 20. For example, when the insulating layer 14 is an oxide, and insulating spacers 20 comprise a nitride, a reactive ion etching (RIE) etch can be used in this step of the present application.

After forming the hard masks 14', the insulating spacers 20 are removed utilizing an etching process that selectively removes the insulating spacers 20. In the embodiment when each of the hard masks 14' is an oxide, and insulating spacers 20 comprise a nitride, a plasma etch or a wet hot phosphoric acid etch can be used in this step of the present application. The resultant structure that is formed after the insulating spacers 20 have been removed from the structure is shown, for example, in FIG. 7.

Figure 8:
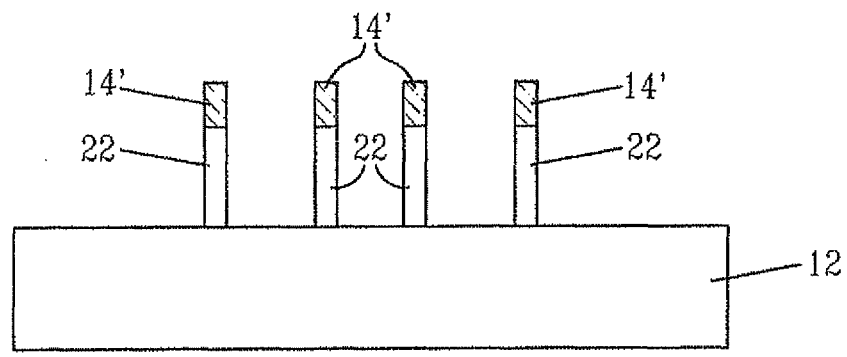

FIG. 8 shows the structure after forming a plurality of Fins 22 (i.e., semiconducting bodies) into the bottom semiconductor layer 12. The plurality of Fins 22 are formed by utilizing a single timed etching process that is selective for removing semiconducting material relative to an insulating material. For example, a reactive ion etching process including $CF_4$ as the etchant chemistry can be used. Each of the Fins 22 so formed has a narrow width from about 10 to about 20 nm, and a vertical height from about 50 to about 100 nm.

In it noted that FIG. 1-8 illustrates the formation of Fins (or semiconductor bodies) 22 in a Si-containing substrate using a sidewall image process.

At this point of the present invention, a thermal oxidation process can optionally be performed to form a sacrificial layer on all of the exposed surfaces shown in FIG. 8. In the drawings of the present invention, this sacrificial oxide layer is not shown for clarity.

Figure 9:
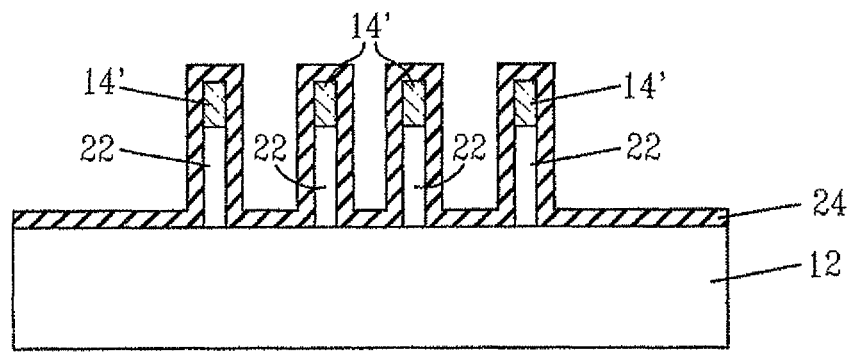

FIG. 9 shows the structure after forming a dielectric layer 24 on all the exposed surfaces of the structure shown in FIG. 8. The dielectric layer 24 is comprised of a different insulator as compared to hard mask 14'. For example, when hard mask 14' is comprised of an oxide, the dielectric layer 24 is comprised of a nitride. The dielectric layer 24 can be formed utilizing one of the techniques described above in forming the dielectric liner 18.

Figure 10:
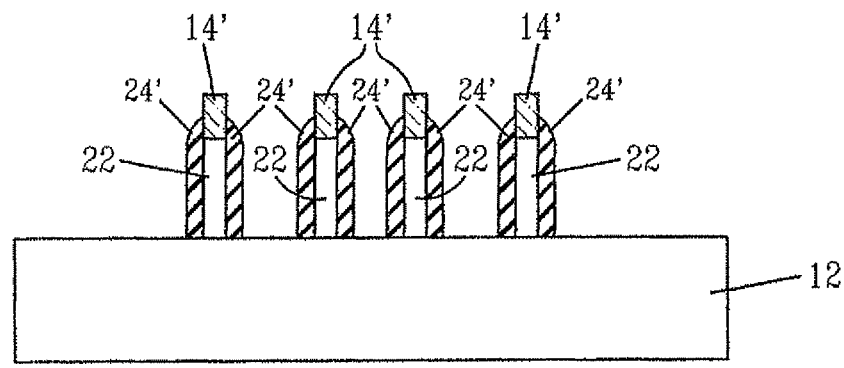

Next, and as is shown in FIG. 10, a timed etching process such as, for example, reactive ion etching is employed to convert the dielectric layer 24 into second insulating spacers 24'. As shown, each insulating spacer 24' that is formed protects a lower portion of each FIN 22, while leaving at least a portion of the hard mask 14' exposed. The timed etching process employed is selective for removing the third insulating layer 24.

A recessed etching process such as, for example, isotopic etching or anisotropic reactive ion etching, is then performed to form a pedestal region 26 within the bottom semiconductor layer 12 that is beneath (i.e., at the footprint) of each of the Fins 22. The resultant structure including the pedestal region 26 is shown, for example, in FIG. 11.

Figure 11:
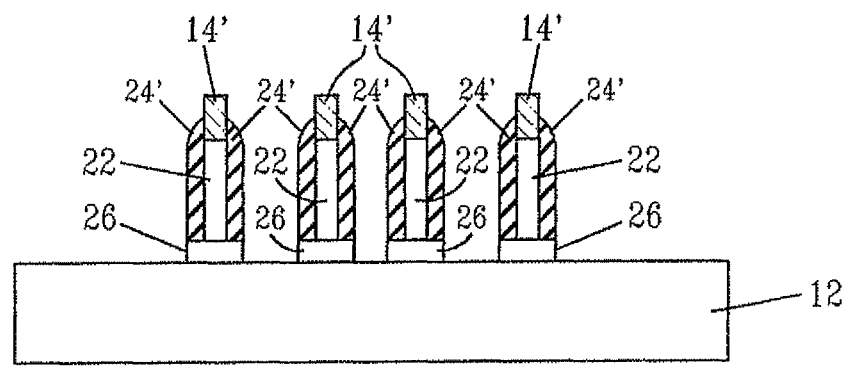
Figure 12:
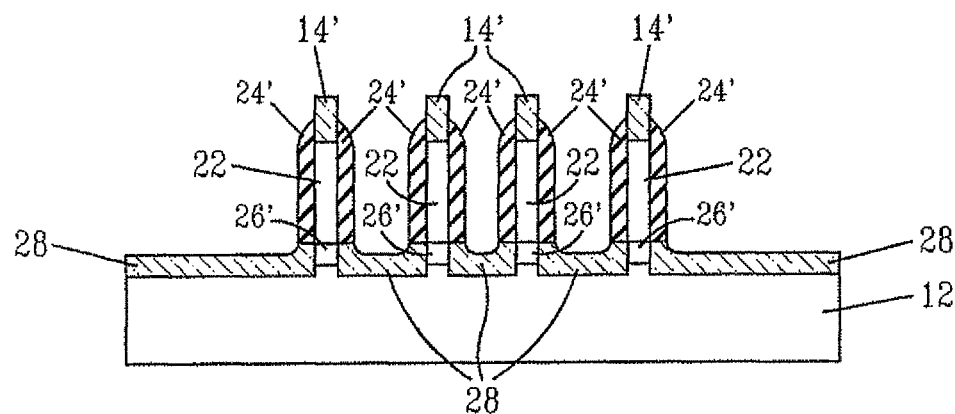

FIG. 12 shows the structure of FIG. 11 after performing a local oxidation process that grows oxide liner 28 on all exposed surfaces. The thickness of the oxide liner 28 that is formed should be limited in a way such that semiconductor material 26' is left beneath each of the Fins 22. Note that during the local oxidation process, the oxide liner consumes some of the pedestal region 26. The local oxidation process is performed in an oxygen-containing ambient and an oxidation temperature of about 1000° C. or greater is typically employed.

Figure 13:
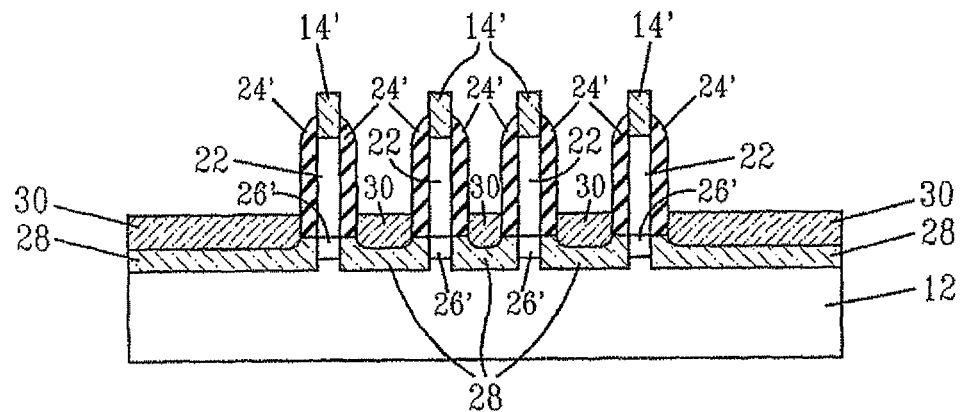

In the next step of the present invention, an anisotropic oxide is deposited using a high density plasma CVD process. The characteristic of this process is a bottom up fill with limited deposition on the sidewalls of each of the Fins 22. A sidewall oxide etch back process is then performed forming the structure which is shown in FIG. 13. In FIG. 13, reference numeral 30 denotes the deposited and etched back high-density plasma oxide.

Figure 14:
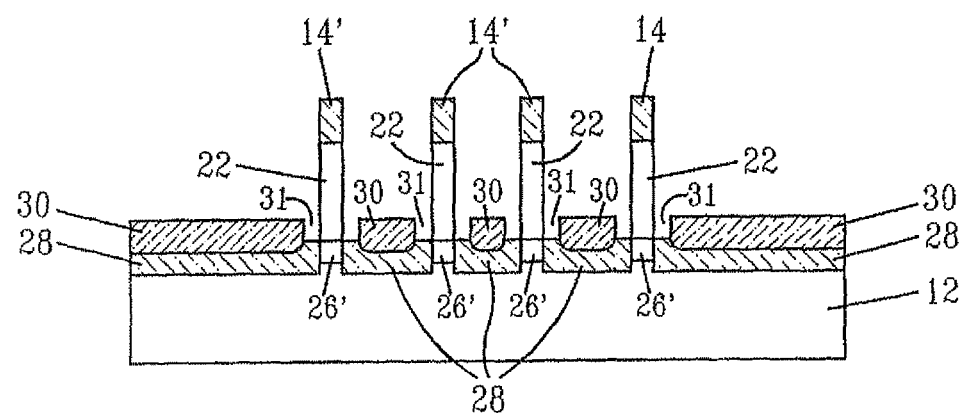

FIG. 14 shows the structure that is formed after selectively removing the insulating spacers 24' from the structure. Specifically, an etching process that selectively removes the spacer material relative to oxide and semiconducting material is used in this step of the present application. In particular, and when the insulating spacers 24' are nitride, an intrinsic plasma etch of a hot phosphoric acid etch is employed. It is noted that a gap 31 forms as shown in FIG. 14. This gap 31 offers a thinner oxide at the gate to source/drain overlap region, while still maintaining a thicker oxide between Fins. This provides a good gate to source/drain control, while keeping gate-to-gate capacitance low.

After forming the structure shown in FIG. 14, the optional sacrificial oxide layer is removed by a HF based wet etch, and a gate dielectric such as an oxide, nitride, oxynitride, or multilayers thereof is then formed. The gate dielectric which is present on the sidewalls of each of the Fins, has been omitted for clarity. The gate dielectric can be formed by a thermal growth process such as, for example, oxidation, nitridation or oxynitridation. Alternatively, the gate dielectric can be formed by a deposition process such as, for example, chemical vapor deposition (CVD), plasma-assisted CVD, metalorganic chemical vapor deposition (MOCVD), atomic layer deposition (ALD), evaporation, reactive sputtering, chemical solution deposition and other like deposition processes. The gate dielectric may also be formed utilizing any combination of the above processes.

The gate dielectric is comprised of an insulating material having a dielectric constant of about 4.0 or greater. All dielectric constants mentioned herein are relative to a vacuum unless otherwise noted. In one embodiment, the gate dielectric comprises a high k material. The term "high k" denotes a dielectric having a dielectric constant of greater than 4.0, preferably greater than 7.0. Specifically, the gate dielectric employed in the present invention includes, but is not limited to: an oxide, nitride, oxynitride and/or silicate including metal silicates and nitrided metal silicates. In one embodiment, it is preferred that the gate dielectric is comprised of an oxide such as, for example, $SiO_2$, $HfO_2$, $ZrO_2$, $Al_2O_3$, $TiO_2$, $La_2O_3$, $SrTiO_3$, $LaAlO_3$, $Y_2O_3$, $Ga_2O_3$, GdGaO and mixtures thereof. Highly preferred examples of gate dielectrics include $HfO_2$, hafnium silicate and hafnium silicon oxynitride. The physical thickness of the gate dielectric may vary, but typically, the gate dielectric has a thickness from about 0.5 to about 10 nm, with a thickness from about 0.5 to about 3 nm being more typical.

Next, a gate electrode 32 is formed. The gate electrode 32 is comprised of a conductive material, including, for example, polySi, SiGe, a metal, a metal alloy, a metal silicide, a metal nitride, a metal carbide or combinations including multilayers thereof. When multilayers are present, a diffusion barrier (not shown), such as TiN or TaN, can be positioned between each of the conductive layers.

The gate electrode 32 is formed utilizing a conventional deposition process including, for example, chemical vapor deposition, plasma enhanced chemical vapor deposition, atomic layer deposition, sputtering, plating, evaporation and any other like deposition processes. In embodiments in which poly Si or SiGe are used as the gate electrode 32, an in-situ deposition process can be used or alternatively deposition followed by ion implantation can be used. The thickness of the gate electrode 32 is not critically to the present invention. Typically, however, the thickness of the gate electrode 32 is from about 50 to about 200 nm.

After forming the gate dielectric and the gate electrode 32, the gate electrode 32 is planarized utilizing a conventional planarization process such as, for example, chemical mechanical polishing (CMP) and/or grinding. The resultant structure including the planarized gate electrode 32 is shown, for example, in FIG. 15.

Figure 15:
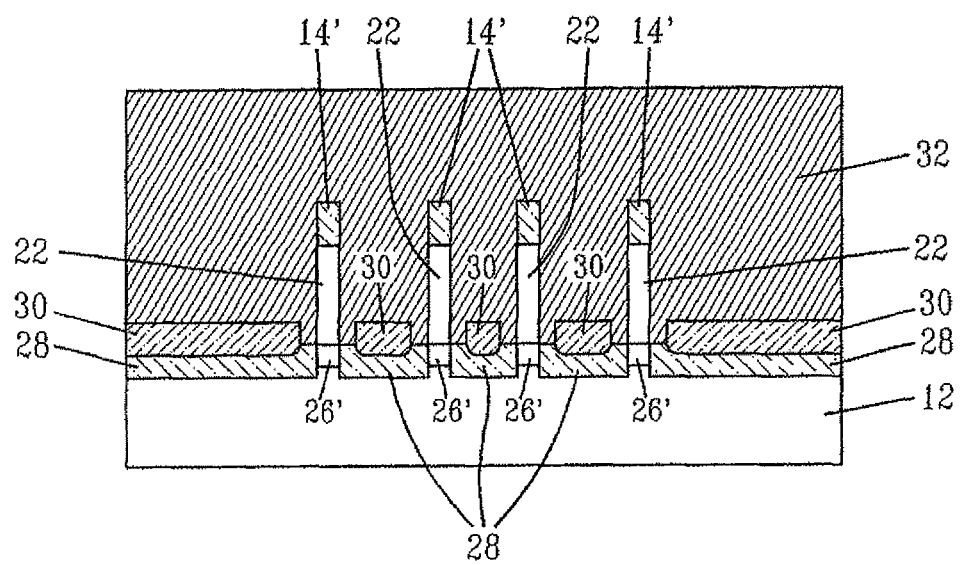

Following the above processing steps which form the structure shown in FIG. 15 conventional CMOS processing steps including the patterning of the gate conductor, spacer formation, halo, extension and source/drain implantations, and metallization can be performed.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A semiconductor structure comprising:
    a semiconductor substrate comprising at least one raised surface located above and vertically offset from a recessed surface of said semiconductor substrate;
    a FinFET located on said raised surface of the semiconductor substrate, wherein said FinFET includes a gate dielectric and a gate electrode surrounding a semiconductor body;
    an oxide liner located directly on said recessed surface of said semiconductor substrate and having an uppermost surface that is coplanar with said raised surface of said semiconductor substrate, and a recessed surface vertically offset and located beneath said uppermost surface of said oxide liner and positioned between said uppermost surface of said oxide liner and a bottommost surface of said oxide liner, wherein no portion of said oxide liner extends beneath the semiconductor body; and
    an etched back anisotropic oxide located directly on said recessed surface of said oxide liner and spaced apart from said semiconductor body by said gate dielectric and a first portion of said gate electrode that are located in a region between a vertical sidewall of said etched back anisotropic oxide and a vertical sidewall said semiconductor body and on said uppermost surface of said oxide liner, wherein said first portion of said gate electrode directly contacts said uppermost surface of said oxide liner and wherein a second portion of said gate electrode directly contacts an uppermost surface of said etched back anisotropic oxide, said first portion and said second portion of said gate electrode are located on one side of the semiconductor body and said uppermost surface of said etched back anisotropic oxide is vertically offset and located entirely beneath an uppermost surface of said semiconductor body and entirely beneath an uppermost surface of said gate electrode.

2. The structure of claim 1 wherein said semiconductor substrate and said semiconductor body comprise a same Si-containing semiconductor material.

3. The structure of claim 1 wherein said FinFET includes an oxide hard mask located on said uppermost surface of said semiconductor body.

4. The structure of claim 1 wherein said oxide liner is a thermal oxide.

5. The structure of claim 1 wherein said gate dielectric is an oxide.

6. The structure of claim 1 wherein said gate conductor comprises polySi.

7. The structure of claim 1 wherein said gate dielectric has a dielectric constant of greater than 7.0.

8. The structure of claim 7 wherein said gate dielectric is selected from the group consisting of $HfO_2$, $ZrO_2$, $Al_2O_3$, $TiO_2$, $La_2O_3$, $SrTiO_3$, $LaAlO_3$, $Y_2O_3$, $Ga_2O_3$, and GdGaO.

9. The structure of claim 1 wherein said semiconductor body has a width from about 10 nm to about 20 nm, and a vertical height from about 50 to about 100 nm.

10. The structure of claim 1 wherein said etched back anisotropic oxide is a plasma oxide and said oxide liner is a thermal oxide.

11. The structure of claim 1 wherein said etched back anisotropic oxide is a different oxide than the oxide liner.

12. The structure of claim 1 wherein said gate conductor is present directly above said uppermost surface of said semiconductor body and on each side of the semiconductor body.

* * * * *